United States Patent
Nakada

[11] Patent Number: 5,876,789
[45] Date of Patent: Mar. 2, 1999

[54] METHOD AND APPARATUS FOR MANUFACTURING RADIO FREQUENCY BOARD WITH CURVED SURFACE

[75] Inventor: Taihei Nakada, Yokohama, Japan

[73] Assignee: Kabushiki Kaisha Toshiba, Kawasaki, Japan

[21] Appl. No.: 747,930

[22] Filed: Nov. 12, 1996

[30] Foreign Application Priority Data

Nov. 16, 1995 [JP] Japan .................................. 7-298369

[51] Int. Cl.⁶ .................................. B05D 5/12; B28B 7/22
[52] U.S. Cl. .................................. 427/96; 427/97; 427/388.1; 427/409; 264/138; 264/139; 264/104; 264/255
[58] Field of Search .................................. 427/96, 97, 388.1, 427/409; 264/138, 139, 255, 104

[56] References Cited

U.S. PATENT DOCUMENTS

| | | | |
|---|---|---|---|
| 3,007,997 | 11/1961 | Panariti | 427/96 |
| 3,536,800 | 10/1970 | Hubbard | 264/104 |
| 3,889,363 | 6/1975 | Davis | 264/104 |
| 4,200,975 | 5/1980 | Debiec et al. | 427/96 |
| 4,772,496 | 9/1988 | Maeda et al. | 428/35 |
| 4,828,877 | 5/1989 | Kidd | 427/96 |
| 4,861,640 | 8/1989 | Gurol | 427/96 |
| 4,937,935 | 7/1990 | Calriou | 427/96 |

*Primary Examiner*—Brian K. Talbot
*Attorney, Agent, or Firm*—Oblon, Spivak, McClelland, Maier & Neustadt, P.C.

[57] ABSTRACT

In a first step, a conductive layer a1 is formed on a three-dimensionally curved upper surface of a main mold. In a second step, a peripheral surface mold is attached to the outer peripheral surface of the main mold, and a liquid dielectric of an age hardening type is cast onto the conductor layer, and hardened. In a third step, the peripheral surface mold is detached from the main mold, and an unnecessary portion of the hardened dielectric is cut to thereby form a dielectric layer. In a fourth step, another conductor layer is formed on the dielectric layer. A method comprising these steps enables a dielectric board with a voluntary three-dimensionally curved surface to be manufactured with high accuracy.

6 Claims, 5 Drawing Sheets

F I G. 2A 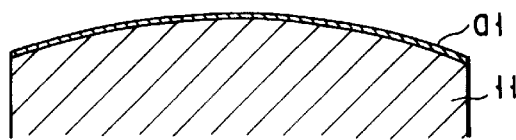
F I G. 2B 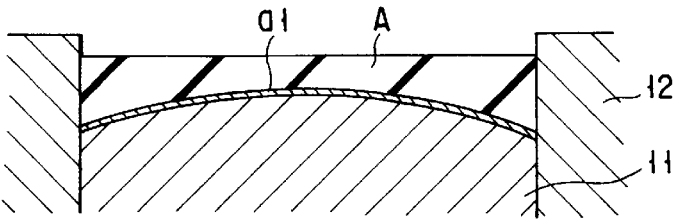
F I G. 2C 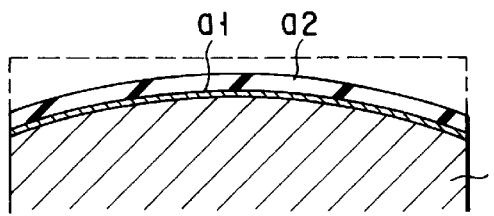
F I G. 2D 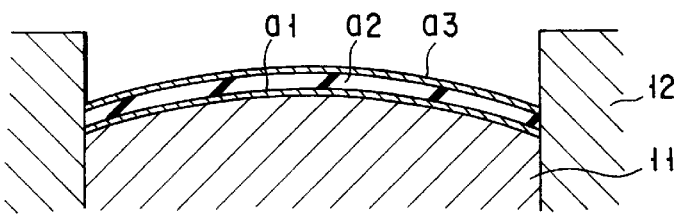
F I G. 2E 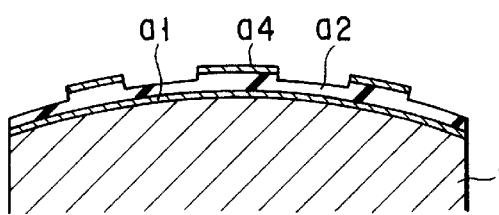
F I G. 2F 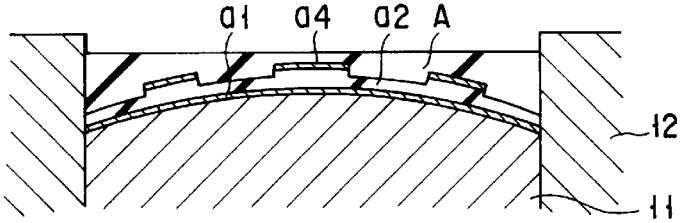
F I G. 2G 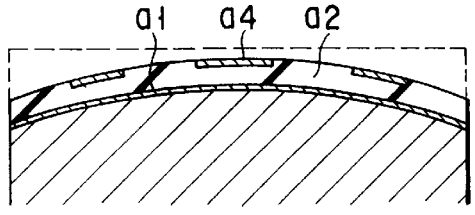
F I G. 2H 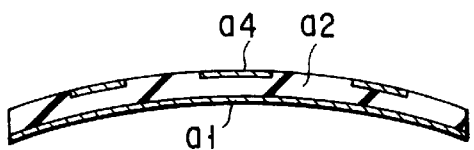

METHOD AND APPARATUS FOR MANUFACTURING RADIO FREQUENCY BOARD WITH CURVED SURFACE

BACKGROUND OF THE INVENTION

1. Field of the Invention

This invention relates to a method and an apparatus for manufacturing a curved board such as a dielectric board with a three-dimensionally curved surface (like a semispherical surface) on which surface a great number of printed antenna elements are arranged.

2. Description of the Related Art

In the conventional case of manufacturing an array antenna, its dielectric board is formed by laminating flat dielectric layers and copper foil layers on each other and attaching them at high temperature under high pressure. The thus-formed flat dielectric board is curved in the next step.

Further, in the case of manufacturing a curved printed wiring board, various methods are now being used—a method for first etching a flat board, and then curving the board into a shape similar to part of a cylinder or a cone; a method for producing a curved board with a relatively low curvature, and etching the board in units of one local spot which corresponds to each element; or a method for designing a curved board divided into portions with relatively low curvatures, forming these divided portions of small flat boards, and attaching the flat boards to each other after subjecting them to an etching process, thereby forming a single large curved board.

In each of the above-mentioned methods, processing at high temperature and under high pressure is necessary to shape a board or to make a board with a multi-layer structure. High temperature and pressure may well cause a change in size of the board, which cannot be ignored in producing the board. As regards etching, in the method in which etching is performed spot by spot, the line width of a continuous line pattern, for example, is hard to accurately set if adjacent spots intersect each other.

Even if an allowable range of changes in size or variations in accuracy is set, it significantly narrows the range of allowable curved surface shapes or limits the performance of products, in particular, in the case of boards for a high frequency antenna. As a result, a desired curved surface shape is hard to select.

SUMMARY OF THE INVENTION

As described above, in the conventional methods for manufacturing a curved board, a flat board is first processed and then curved. Therefore, a change in size of a board cannot be ignored, since it may raise a problem on accuracy, and at worst, may make it impossible to produce a curved board. In other words, the change makes it difficult to select a desired curved surface shape.

The invention has been developed to solve the above problems, and the object of the invention is to provide a method and an apparatus for enabling a desired curved surface shape or required performance to be freely selected, thereby manufacturing dielectric, printed wiring and multi-layer boards with any desired curved surfaces.

(1) The method of the invention for manufacturing a board with a curved surface is characterized by the steps of casting a liquid dielectric of an age hardening type into a mold with a three-dimensionally curved surface, hardening it, and cutting an unnecessary portion of the liquid dielectric, to thereby forming a dielectric board with a voluntary three-dimensionally curved surface.

Since in this method, the board is not deformed, it can be produced with high accuracy, and any desired curved surface shape can be selected freely.

(2) The method of the invention is characterized by comprising: the first step of forming a conductive layer on a three-dimensionally curved upper surface of a main mold; the second step of attaching a peripheral surface mold to an outer peripheral surface of the main mold, casting a liquid dielectric of an age hardening type onto the conductor layer, and hardening the liquid dielectric; the third step of detaching the peripheral surface mold from the main mold, and cutting an unnecessary portion of the hardened dielectric to thereby form a dielectric layer; and the fourth step of forming another conductor layer on the dielectric layer.

This method can produce a curved dielectric board with conductor layers and a dielectric layer interposed therebetween.

(3) The method of the invention is characterized by comprising: the first step of forming a conductive layer on a three-dimensionally curved upper surface of a main mold; the second step of attaching a peripheral surface mold to an outer peripheral surface of the main mold, casting the liquid dielectric of the age hardening type onto the conductor layer, and hardening the liquid dielectric; the third step of detaching the peripheral surface mold from the main mold, and cutting an unnecessary portion of the hardened dielectric to thereby form a dielectric layer; the fourth step of forming a wiring conductor layer on the dielectric layer; the fifth step of cutting the wiring conductor layer such that a wiring pattern remains in a necessary area; the sixth step of again attaching the peripheral surface mold to the main mold, casting the age hardening type liquid dielectric and hardening the liquid dielectric; and the seventh step of detaching the peripheral surface mold and cutting the hardened dielectric such that the surface of the wiring pattern is exposed.

This method can produce a curved printed wiring board with a dielectric layer and a conductor layer and a wiring pattern respectively formed on the opposite surfaces of the dielectric layer.

(4) The method of the invention is characterized by comprising: the first step of forming a conductive layer on a three-dimensionally curved upper surface of a main mold; the second step of attaching a peripheral surface mold to an outer peripheral surface of the main mold, casting the liquid dielectric of the age hardening type onto the conductor layer, and hardening the liquid dielectric; the third step of detaching the peripheral surface mold from the main mold, and cutting an unnecessary portion of the hardened dielectric to thereby form a dielectric layer; the fourth step of forming a wiring conductor layer on the dielectric layer; the fifth step of cutting the wiring conductor layer such that a wiring pattern remains in a necessary area; the sixth step of again attaching the peripheral surface mold to the main mold, casting the age hardening type liquid dielectric and hardening the liquid dielectric; the seventh step of detaching the peripheral surface mold and cutting the hardened dielectric such that the dielectric has a predetermined thickness; and the eighth step of forming a further conductor layer on the resultant structure.

This method can produce a curved multi-layer board with a dielectric layer, conductor layers formed on the opposite surfaces of the dielectric layer, and a wiring pattern formed in the dielectric layer.

(5) In the method in item 4, the fifth and sixth steps are repeated to form multi-layered wiring patterns.

(6) The method in item 4 is characterized by further comprising the step of providing a metallic pin in a voluntary portion of the wiring pattern between the fifth and sixth steps, and wherein in the seventh step, the metallic pin is cut to a predetermined height at the time of cutting the dielectric.

(7) The method in item 4 is characterized by further comprising the step of forming a hole, which extends to the wiring pattern, between the seventh and eighth steps, and wherein in the eighth step, a conductor layer is provided on the peripheral surface and the bottom of the hole to thereby provide an electrically connecting through hole.

(8) The apparatus of the invention for manufacturing a board with a curved surface, is characterized by comprising a cylindrical main mold with a three-dimensionally curved end face for determining a lower surface of the board to be manufactured; and a peripheral surface mold for inserting therein the main mold.

(9) The apparatus in item 8 is characterized by further comprising a three-dimensionally cutting machine.

(10) The apparatus of the invention is characterized by comprising a cylindrical main mold with a three-dimensionally curved end face for determining a lower surface of the board to be manufactured; and a cylindrical peripheral/upper surface mold with an upper portion to be opposed to the three-dimensionally curved end face of the main mold when it receives therein the main mold.

(11) The apparatus in item 10 is characterized in that a through hole for filling therethrough a liquid dielectric of an age hardening type is formed in an upper portion of the peripheral/upper surface mold.

(12) The apparatus in item 10 is characterized in that a stopper is provided on at least one of the main mold and the peripheral/upper surface mold for limiting a clearance defined therebetween.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 2A, 2B, 2C, 2D, 2E, 2F, 2G and 2H are views, useful in explaining a process, according to a second embodiment of the invention, for manufacturing a printed wiring board with a curved surface;

DETAILED DESCRIPTION OF THE PREFERRED EMBODIMENTS

The embodiments of the invention will be described in detail with reference to the accompanying drawings.

Figure 1A:
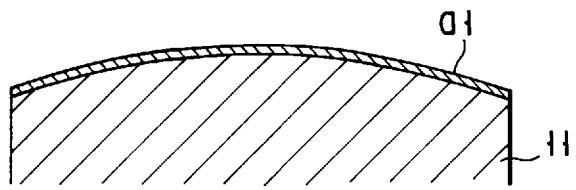
FIGS. 1A, 1B, 1C, 1D and 1E are views, useful in explaining a process, according to a first embodiment of the invention, for manufacturing a dielectric board with a curved surface.
Figure 1B:
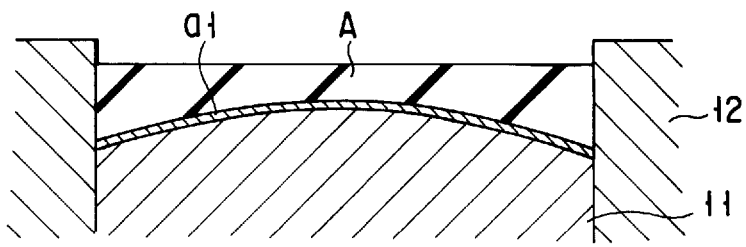

FIGS. 1A to 1E are views, useful in explaining a process, according to a first embodiment of the invention, for manufacturing a dielectric board with a curved surface. First, as is shown in FIG. 1A, a conductor layer a1 is formed by depositing, for example, a copper foil film on a three-dimensionally-curved cylindrical mold 11 which has a convex upper surface for imparting a concave surface to a board placed thereon. Then, as is shown in FIG. 1B, a peripheral wall mold 12 is attached to the outer peripheral surface of the mold 11, and a liquid dielectric A of an age hardening type is cast into the space defined by the molds 11 and 12, and hardened.

Figure 1C:
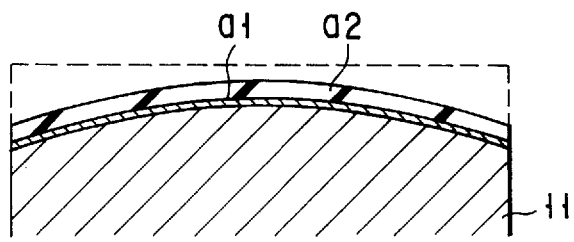
Figure 1D:
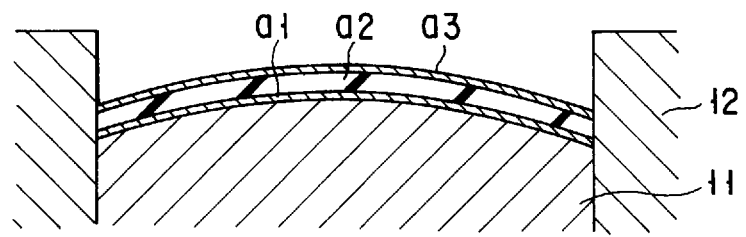

After the age hardening liquid dielectric A is completely hardened, a dielectric layer a2 of an accurate size is formed by detaching the peripheral wall mold 12 and cutting an unnecessary portion of the dielectric A by means of a three-dimensionally-cutting machine, as is shown in FIG. 1C. Subsequently, as is shown in FIG. 1D, the peripheral wall mold 12 is again attached, thereby forming a conductive layer a3 on the upper surface of the dielectric layer a2 by deposition.

Figure 1E:
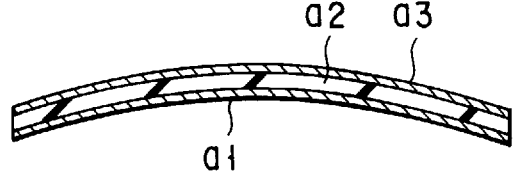

Thereafter, as is shown in FIG. 1E, the three-dimensional mold 11 and the peripheral wall mold 12 are detached to thereby obtain a dielectric board with a curved surface consisting of the dielectric layer a2 and the conductive layers a1 and a3 respectively formed on the opposite surfaces of the layer a2. Since in this case, no portion of the layers is deformed, the resultant board can have an extremely accurate size.

FIGS. 2A to 2H are views, useful in explaining a process, according to a second embodiment of the invention, for manufacturing a printed wiring board with a curved surface. The process steps shown in FIGS. 2A to 2D are similar to those shown in FIGS. 1A to 1D. In the next step shown in FIG. 2E, the peripheral wall mold 12 is detached, and a wiring pattern a4 of an accurate size is formed by means of a three-dimensionally-cutting machine.

Thereafter, as is shown in FIG. 2F, the peripheral wall mold 12 is again attached, and the age hardening type liquid dielectric A is cast in the space defined by the molds 11 and 12 and the resultant layer structure, and then hardened. Then, as is shown in FIG. 2G, the peripheral wall mold 12 is detached, and an unnecessary portion of the dielectric A is cut to the surface of the wiring pattern a4 by means of a three-dimensionally-cutting machine. As a result, portions too deeply cut in the step of FIG. 2E are filled with the dielectric.

Thereafter, as is shown in FIG. 2H, the three-dimensionally-curved mold 11 is detached to leave a printed wiring board with a curved surface consisting of the dielectric layer a2, and the conductive layer a1 and the wiring pattern a4 respectively formed on the opposite surfaces of the dielectric layer a2.

FIGS. 3A to 3H are views, useful in explaining a process, according to a third embodiment of the invention, for manufacturing a multi-layer board with a curved surface. The process steps shown in FIGS. 3A to 3F are similar to those shown in FIGS. 2A to 2F. In the next step shown in FIG. 3G, the peripheral wall mold 12 is detached, and the dielectric layer is cut to a predetermined thickness by means of a three-dimensionally-cutting machine.

Figure 3A:
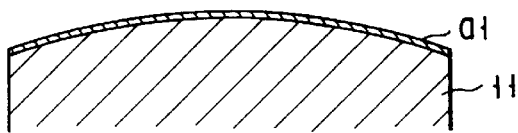
FIGS. 3A, 3B, 3C, 3D, 3E, 3F, 3G and 3H are views, useful in explaining a process, according to a third embodiment of the invention, for manufacturing a multi-layer board with a curved surface.
Figure 3B:
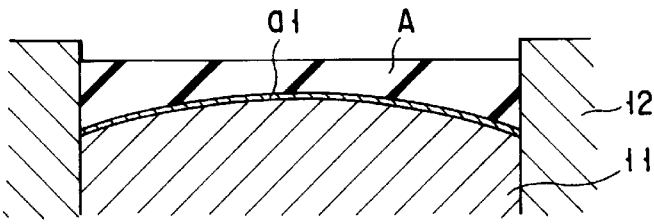
Figure 3C:
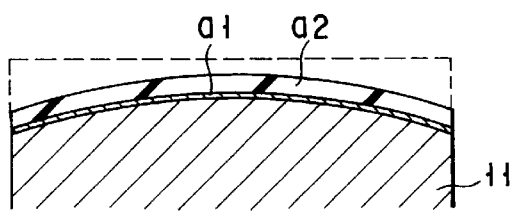
Figure 3D:
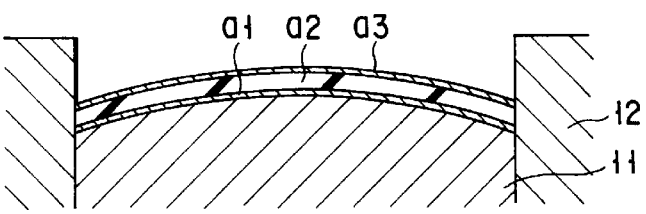
Figure 3E:
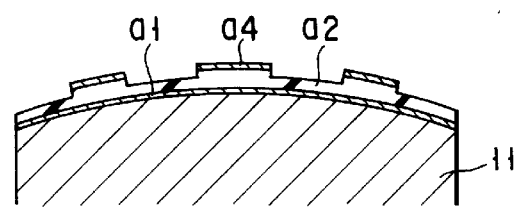
Figure 3F:
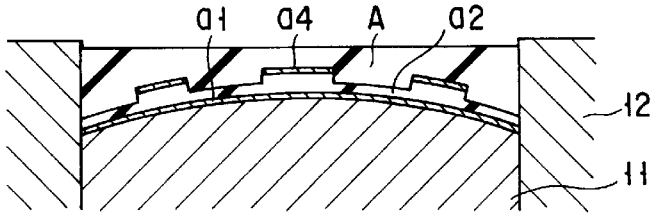
Figure 3G:
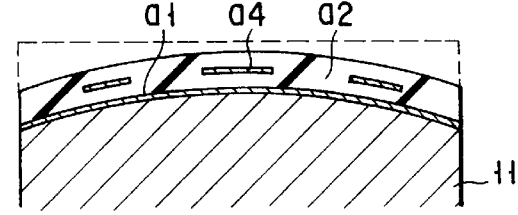
Figure 3H:
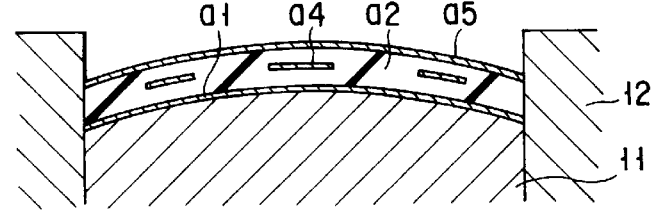

Thereafter, as is shown in FIG. 3H, the peripheral wall mold 12 is again attached, and a conductor layer a5 is formed by deposition, etc. Subsequently, the molds 11 and 12 are detached, thereby obtaining a multi-layer board with a curved surface consisting of the dielectric layer a2, the conductor layers a1 and a5 respectively formed on the opposite surface of the dielectric layer a2, and the wiring pattern a4 formed at a middle portion of the dielectric layer a2.

It is a matter of course that a multi-layer board with multiple wiring patterns within the board can be obtained by repeating the steps shown in FIGS. 3F and 3G.

Figure 4A:
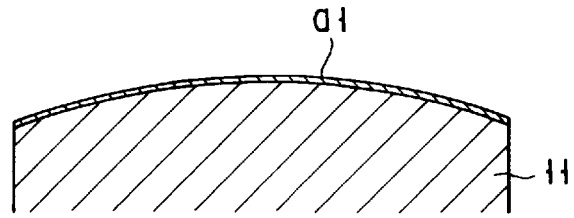
FIGS. 4A, 4B, 4C and 4D are views, useful in explaining another process, according to a fourth embodiment of the invention, for manufacturing a dielectric board with a curved surface.
Figure 4B:
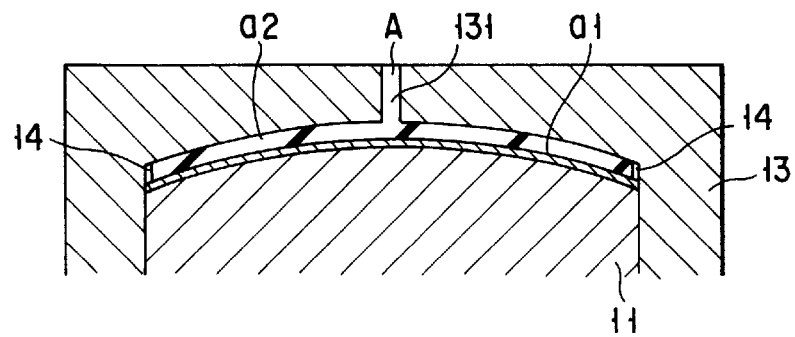

FIGS. 4A to 4D are views, useful in explaining another process, according to a fourth embodiment of the invention, for manufacturing a dielectric board with a curved surface. First, as is shown in FIG. 4A, a conductor layer a1 is formed on a three-dimensionally-curved cylindrical mold 11 which has a convex upper surface for imparting a concave surface to a board placed thereon. Then, as is shown in FIG. 4B, a peripheral/upper surface mold 13 which has a peripheral surface corresponding to the outer peripheral surface of the mold 11, and a surface to be opposed to the conductor layer a1 is put on the mold 11 with the conductor layer a1 such that a clearance identical to the thickness of a dielectric layer a2 to be formed is defined between the conductor layer a1 and that surface of the mold 13 opposed thereto. A liquid dielectric A of the age hardening type is filled in the clearance through a hole 131 formed in an upper middle portion of the mold 13, and then hardened.

Figure 4C:
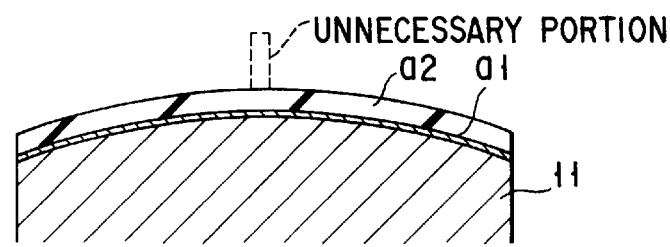
Figure 4D:
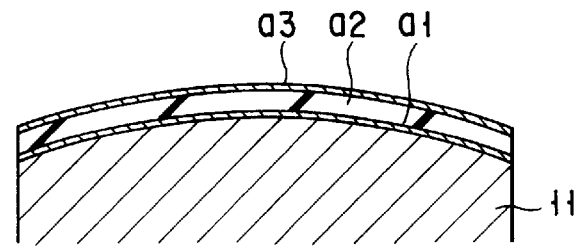

Subsequently, as is shown in FIG. 4C, the peripheral/upper surface mold 13 is detached, and the unnecessary portion of the dielectric which is filled in the hole 131 is cut out, thereby forming a dielectric layer a2. Further, as is shown in FIG. 4D, a conductor layer a3 is formed on the dielectric layer a2 by deposition, etc., and then the mold 11 is detached to obtain a dielectric board with a curved surface.

Although in the above embodiment, the peripheral/upper surface mold 13 has a single through hole 131, a plurality of through holes may be formed in the mold 13. In this case, air can be allowed to leak at the time of filling the age hardening type liquid dielectric A therein, which enhances the working efficiency.

Moreover, if a stopper 14 is provided on an inner peripheral portion of the peripheral/upper mold 13 or on an upper surface portion of the three-dimensionally curved mold 11, the clearance between the molds 11 and 13 can easily be set equal to the required thickness of the dielectric layer a2, which also enhances the wording efficiency.

It is a matter of course that the peripheral/upper surface mold 13 can be also used to produce a printed wiring board or a multi-layer board.

In the third embodiment, a method using a metallic pin or a through hole is employed as an interlayer connecting method.

Figure 5A:
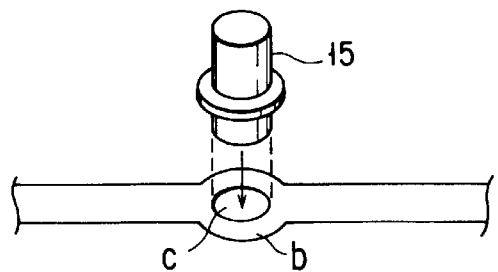
FIGS. 5A, 5B, 5C, 5D and 5E are views, useful in explaining a an interlayer connecting method using a pin according to a modification of the third embodiment of the invention.
Figure 5B:
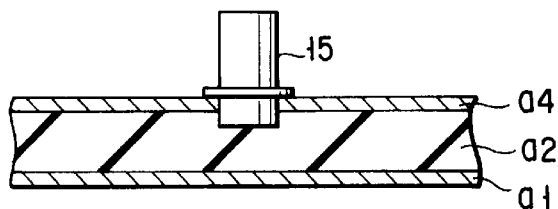
Figure 5C:
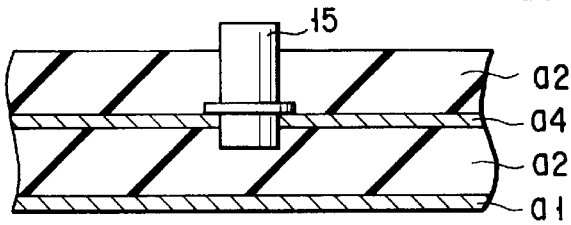

Referring to FIGS. 5A to 5E, the interlayer connecting method using a metallic pin will be described. In this method, a hole c with a diameter and a depth enough to insert therein a metallic pin 15 is formed in a land portion b, after the wiring pattern a4 is formed (FIG. 5A). Then, the metallic pin 15, which has an appropriate length and a flange at a center portion thereof, is inserted through the hole c, and fixed to the dielectric layer by solder, etc. (FIG. 5B).

Figure 5D:
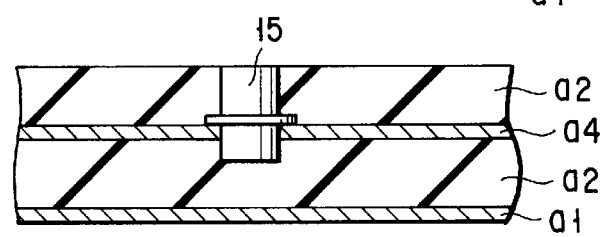
Figure 5E:
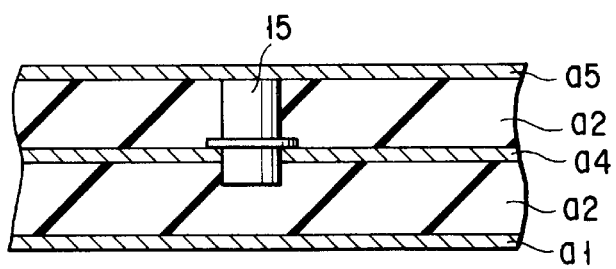

Thereafter, the dielectric layer a2 is formed in the above-described manner (FIG. 5C), and then that portion of the metallic pin 15 which projects from the dielectric layer a2 is cut (FIG. 5D). Subsequently, the surface conductor layer a5 is formed in the aforementioned manner (FIG. 5E). Thus, the wiring pattern a4 buried in the dielectric layer a2 is connected to the surface conductor layer a5.

Figure 6:
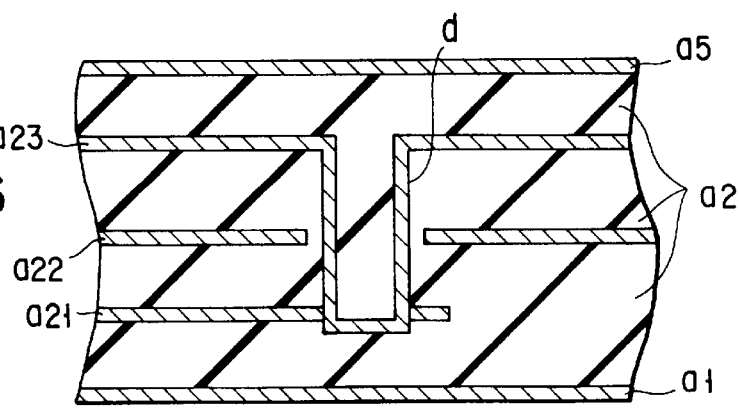
FIG. 6 is a view, useful in explaining a an interlayer connecting method using a through hole according to another modification of the third embodiment of the invention.

Referring then to FIG. 6, the interlayer connection by a through hole will be described. In FIG. 6, first through third conductor layers a21, a22 and a23 are formed in the dielectric layer a2, and the first and third conductor layers a21 and a23 are connected to each other. Further, in FIG. 6, a1 denotes a reverse-surface conductor layer, a5 a surface conductor layer, and a2 the dielectric layer.

In this case, at the time of forming the second conductor layer a22, a conductor-nonexistent area with a diameter larger than that of a through hole d formed later is formed in the layer a22, and then the through hole d extending to the first conductor layer a21 is formed before the third conductor layer a23 is formed. Then, the third conductor layer a23 is provided, by deposition, on the upper surface of the dielectric layer and on the peripheral surface and the bottom of the hole d. Thus, a through hole is formed, which connects the first conductor layer a21 to the third conductor layer a23 without connecting them to the second conductor layer a22.

As described above, a combination of techniques for forming an age hardening type liquid dielectric, for using a three-dimensionally-cutting machine, and for forming conductor layers by deposition, etc. can form a dielectric, pattern wiring or multi-layer board with any desired curved surface. This means that application of the present invention, for example, to a board for high frequency enables the board to be designed and produced in accordance with any voluntary curved surface such as the curved surface of a machine for mounting thereon an antenna element and its power supply circuit.

As described above, the present invention can provide a method for enabling any curved surface shape and any required performance to be selected freely.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a high-frequency board with a curved surface, comprising the steps of:

forming a conductive layer on a three-dimensionally curved upper surface of a main mold;

attaching a peripheral surface mold to an outer peripheral surface of the main mold, casting a liquid dielectric onto the conductive layer, and hardening the liquid dielectric;

detaching the peripheral surface mold from the main mold, and cutting the surface at the hardened dielectric such that the dielectric has a uniform thickness to thereby form a dielectric layer; and forming a second conductive layer on the dielectric layer.

2. A method for manufacturing a high frequency wiring board with a curved surface, comprising the steps of:

forming a conductive layer on a three-dimensionally curved upper surface of a main mold;

attaching a peripheral surface mold to an outer peripheral surface of the main mold, casting the liquid dielectric onto the conductive layer, and hardening the liquid dielectric;

detaching the peripheral surface mold from the main mold, and cutting the surface of the hardened dielectric to thereby form a dielectric layer having a uniform thickness;

forming a wiring conductive layer on the dielectric layer;

cutting the wiring conductive layer such that a wiring pattern remains in a predetermined area;

attaching again the peripheral surface mold to a main mold, casting the liquid dielectric and hardening the liquid dielectric; and detaching the peripheral surface mold and cutting the hardened dielectric such that the surface of the wiring pattern is exposed.

3. A method for manufacturing a high-frequency wiring board with a curved surface, comprising:

a first step of forming a conductive layer on a three-dimensionally curved upper surface of a main mold;

a second step of attaching a peripheral surface mold to an outer peripheral surface of the main mold, casting the liquid dielectric onto the conductive layer, and hardening the liquid dielectric;

a third step of detaching the peripheral surface mold from the main mold, and cutting a surface of the hardened dielectric to thereby form a dielectric layer having a uniform thickness;

a fourth step of forming a wiring conductive layer on the dielectric layer;

a fifth step of cutting the wiring conductive layer such that a wiring pattern remains in a predetermined area;

a sixth step of attaching again the peripheral surface mold to the main mold, casting the liquid dielectric and hardening the liquid dielectric;

a seventh step of detaching the peripheral surface mold and cutting the hardened dielectric such that the dielectric has a predetermined thickness; and an eighth step of forming a second conductor layer on the resultant structure.

4. The method according to claim 3, wherein the fifth and sixth steps are repeated to form multi-layered wiring patterns.

5. The method according to claim 3, further comprising the step of providing a hole in a band portion of the wiring pattern and providing a metallic pin in said hole between the fifth and sixth steps, and wherein in the seventh step, the metallic pin is cut to a predetermined height at the time of cutting the dielectric.

6. The method according to claim 3, further comprising the step of forming a hole, which extends to the wiring pattern, between the seventh and eighth steps, and wherein in the eighth step, a conductor layer is formed on a peripheral surface and a bottom of the hole to thereby provide an electrically connecting through hole.

* * * * *